United States Patent [19]

Marschinke

[11] 3,995,114
[45] Nov. 30, 1976

[54] ULTRA LOW CURRENT AMPLIFIER
[75] Inventor: Richard E. Marschinke, St. Paul, Minn.
[73] Assignee: Dahlberg Electronics, Inc., Minneapolis, Minn.
[22] Filed: Dec. 9, 1975
[21] Appl. No.: 639,061

Related U.S. Application Data
[63] Continuation of Ser. No. 468,525, May 9, 1974, abandoned.

[52] U.S. Cl. .................................. 179/1 A; 330/13; 330/25; 330/28
[51] Int. Cl.² .................... H04R 25/00; H03F 3/183
[58] Field of Search .................. 330/13, 25, 28, 97; 179/1 A, 1 F, 107 R

[56] References Cited
UNITED STATES PATENTS

| | | | |
|---|---|---|---|
| 2,855,468 | 10/1958 | Lohman | 330/13 |
| 3,365,545 | 1/1968 | Petrie | 179/1 F |
| 3,529,252 | 9/1970 | Long | 330/28 X |
| 3,649,925 | 3/1972 | Besser | 330/13 |
| 3,764,929 | 10/1973 | Alves | 330/13 X |
| 3,781,491 | 12/1973 | Biondi et al. | 179/107 R |
| 3,784,750 | 1/1974 | Stearns et al. | 179/107 R X |

Primary Examiner—James B. Mullins
Attorney, Agent, or Firm—Merchant, Gould, Smith, Edell, Welter & Schmidt

[57] ABSTRACT

An amplifier circuit for a hearing aid, for producing moderately high gain and output sound pressure levels, with extremely low current drain on the battery. The output stage uses a pair of complementary transistors, with each providing a dynamic load for the other, and a low impedance receiver. Negative feedback may be taken from an output blocking capacitor to provide sharp low frequency roll-off where necessary for certain types of hearing loss. The circuit can provide an acoustic gain of more than 38 db, at an output sound pressure level of 116 db or more, depending on the load impedance, on only 0.150 milliamperes of current from a 1.35 volt battery.

9 Claims, 3 Drawing Figures

ULTRA LOW CURRENT AMPLIFIER

This is a continuation of application Ser. No. 468,525 filed May 9, 1974 now abandoned.

BACKGROUND OF THE INVENTION

The present invention pertains generally to the field of electronic amplifier circuits for hearing aids, and more specifically to high efficiency circuits which are capable of operating with only an extremely small current drain on the battery, but without any sacrifice in output sound volume.

The major design objective in the hearing aid industry is to provide devices which will restore, as nearly as possible, the ability to hear speech at normal conversational levels to individuals suffering various types of hearing loss, with the least amount of cost and discomfort to the user of the hearing aid. To this end, much effort has gone into reducing the physical size of the aid and in improving the intelligibility of normal speech to a user of the aid. Many recent advances in hearing aid circuit design have unfortunately resulted in an increased number of electronic components, which increases both the physical size and the operating current of the circuit. Circuits designed for increased sound volume output, and also circuits designed for improved intelligibility by advanced signal processing techniques have resulted in larger current drain and shorter battery life.

It is of course desirable to reduce current drain thereby to increase battery life, in order to minimize the battery cost to the user, which in some cases may exceed One Dollar per week. Not only is the economic cost of the replacement batteries important, but the necessity of frequent battery replacement can be a nuisance or an embarrassment to the user. With some prior art hearing aids, the battery must be replaced every few days, and this may lead to anxiety on the part of the user who must continually check to see that replacements are on hand in order to avoid embarrassment should the old battery run down.

The present invention provides an amplifier circuit with such low current drain that it will operate more than three times as long on a given battery as conventional prior art hearing aids which provide comparable output levels. In addition, the circuit used in the present invention may be used with a special feedback circuit to obtain a sharp low frequency roll-off characteristic which is desirable in correcting for certain types of hearing loss.

One type of prior art hearing aid amplifier uses an output transistor operating in Class A, with the receiver connected as the collector load of the transistor. In such a circuit design for a moderately high output (approximately 115 db sound pressure level at saturation with 38 db of acoustic gain), the entire circuit may draw approximately 0.5 milliamperes of current, approximately 80% of which is used in the output stage. Since the output transistor should be biased somewhere near its midpoint in order to avoid clipping and distortion at high output levels, the transistor must be biased so that at its quiescent point, approximately half of the battery voltage is dropped across the output transistor, and the other half across the receiver. In order to avoid drawing excessive quiescent currents, it has been necessary to use a receiver having a relatively high DC resistance, 900 ohms being typical. However, this results in a low efficiency circuit in that when an audio signal is being amplified, a large portion of it is dissipated in the large resistive component of the receiver impedance. Such a circuit will give a life of about 350 to 400 hours on a certain type of mercury battery.

Another type of prior art hearing aid circuit succeeds in reducing the current drain to about 0.25 milliamperes, but only at the expense of reduced maximum sound pressure level output. This type of prior art circuit also uses a Class A output transistor and can achieve approximately 800 hours of operation on the same type of battery, but its maximum output is limited to approximately 108 db sound pressure level at 27 db of acoustic gain. Obviously, this prior art circuit may be useful for persons who do not require a great deal of amplification, but it clearly does not solve the problem of excessive battery drain in higher powered amplifiers.

In contrast, the present invention provides a hearing aid amplifier circuit which is capable of providing greatly reduced current drain, at no sacrifice in maximum output sound pressure level. For example, in one circuit according to the present invention, a maximum average sound pressure level of 116 db (with peaks of 120 db) is achieved, but at a current drain of only 0.150 milliamperes. This gives an average life with the same battery as in the preceding examples of 1300 hours, which is over three times as long as conventional aids in the same power class.

SUMMARY OF THE INVENTION

According to the present invention, there is provided an ultralow current power amplifier for driving the receiver of a hearing aid. A complementary pair of transistors are used with each transistor providing a dynamic load for the other. The collectors of the transistors are interconnected, and their emitters are connected to the appropriate polarities of the battery so as to allow forward current flow through the transistor pair. Means are included for controlling the bias current of the transistors. A partially amplified signal from a preamplifier is applied to the bases of the transistors. The receiver and a blocking capacitor are connected in series between signal ground and the common connection between the collectors of the transistor pair.

In a preferred embodiment, negative AL feedback may be taken from the voltage developed across the blocking capacitor, and this feedback voltage may be sumed into the input of the preamplifier. This negative feedback is not only useful for adjusting the gain of the amplifier, but also provides an extra degree of low frequency roll-off which is advantageous in correcting for certain types of hearing loss.

Figure 1:
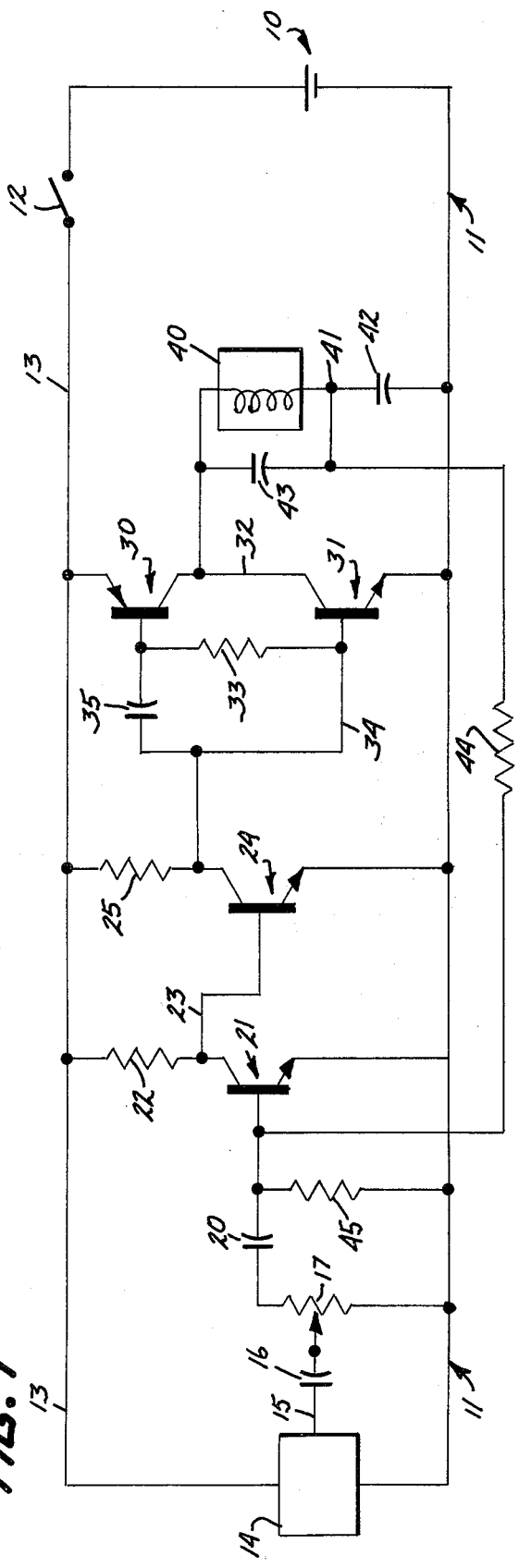
FIG. 1 is a schematic diagram of a preferred embodiment of the present invention.

In the ultralow hearing aid amplifier of FIG. 1, a battery 10 provides the source of DC power to energize the circuit. The negative terminal of battery 10 connected to a lead 11 which serves as a signal ground, and the positive terminal of battery 10 connects through an on-off switch 12 to a lead 13, which is the B+ supply for the circuit. Reference numeral 14 designates the microphone which picks up sounds to be amplified, and converts them into electrical signals appearing at lead 15. The microphone also connects to the signal ground lead 11, to provide a ground reference for the signal on lead 15. Additionally, microphone 14 may comprise an electret or ceramic microphone, in which case a bias potential is applied to microphone 14 from lead 13. This bias is to power an internal preamplifier used in this type of microphone.

The output lead 15 of the microphone is coupled by a capacitor 16 to the adjustable tap of a potentiometer 17, which serves as the volume control. One end of potentiometer 17 is connected to signal ground on lead 11, and the other end connects through a capacitor 20 to the base of an npn transistor 21. The emitter of transistor 21 is connected to signal ground, and its collector connects through a resistor 22 to the positive voltage on lead 13. The collector of transistor 21 is also connected by lead 23 to the base of transistor 24. The emitter of transistor 24 is connected to signal ground, and its collector is connected through a resistor 25 to lead 13.

The output stage comprises a complementary pair of transistors 30 and 31. PNP transistor 30 has its emitter connected to lead 13, while npn transistor 31 has its emitter connected to signal ground, lead 11. The collectors of the two transistors are interconnected by lead 32. A bias resistor 33 is connected to the bases of transistors 30 and 31. The collector of transistor 24 is connected directly to the base of transistor 31 by lead 34, and is connected to the base of transistor 30 through a capacitor 35, which effectively by-passes bias resistor 33.

A receiver 40 is connected to the output of the amplifier, and is preferably a low impedance device as is explained hereinafter. The receiver is the transducer for converting the amplified electrical signals into amplified acoustic signals for the subject to hear. One terminal of receiver 40 is connected to lead 32, and the other terminal is connected to a lead 41. A capacitor 43 is connected in parallel with receiver 40, between leads 32 and 41, and another capacitor 42 is connected between lead 41 and signal ground. A resistor 44 connects from lead 41 to the base of transistor 21, and a resistor 45 connected from the base of transistor 21 to signal ground.

Generally, transistors 21 and 24 and their associated circuitry perform a preamplifier function to amplify signals from the microphone. Transistors 30 and 31 and their associated circuitry generally comprise the output amplifier for driving the receiver 40. In practice, circuit values are chosen to bias transistors 21 and 24 for Class A operation. Resistor 33 is selected to control the bias of transistors 30 and 31, through the current path to the emitter base junction of transistor 30, resistor 33, and the base emitter junction of transistor 31.

The voltage at lead 41 is fed back through a voltage divider to the input of the preamplifier. This feedback voltage consists of a DC component from lead 32 which passes through the receiver 40, and an AC component which is developed across capacitor 42. The DC component is used to adjust the operating point of the output transistors, and the AC component is used to control the overall gain of the circuit and to provide the desired frequency response. The feedback voltage divider includes resistors 44 and 45, the ratio of which determines the proportion of the voltage at lead 41 which is applied to the base of transistor 21. Although changing the value of either of these resistors alters the overall operating characteristics, in practice it is convenient to adjust or select resistor 45 to set the desired quiescent operating point voltage of the output at lead 32. The feedback resistor 44 may then be selected or adjusted in order to adjust the overall AC gain of the circuit. Of course, the wearer of the aid can adjust the sound output volume in a given situation by adjusting potentiometer 17.

The quiescent voltage at lead 32 is adjusted to be half the power supply voltage. Capacitor 42 performs the function of blocking any steady state DC current, while providing an AC signal ground for the receiver. Hence, there is no DC path to ground through the receiver (except for the negligible current through resistors 44 and 45) and very little current is drawn under quiescent conditions. Since no significant DC current flows through the receiver, the efficiency of the circuit is improved.

When an AC signal to be amplified is present, it is coupled through capacitors 16 and 20, amplified by transistors 21 and 24 while undergoing a phase reversal on each occasion, and is then applied directly to the base of transistor 31. Capacitor 35, being in parallel with resistor 33, effectively provides an AC by-pass for the resistor. Accordingly, the signal applied to the base of transistor 31 is also essentially applied to the base of transistor 30 by capacitor 35, at least for the important AC frequencies. This by-pass capacitor is not essential for operation, but is useful for reducing distortion. Transistors 30 and 31 are driven so that one transistor goes further into conduction while the other conducts less during one-half of the AC cycle, and vice-versa during the other half of the cycle. Thus, each transistor provides a dynamic load for the other, and this factor also results in improved efficiency. The voltage at their common collectors on lead 32 accordingly swings in response to the applied signal. This amplified signal at lead 32 is applied through receiver 40 and capacitor 42 to signal ground. Capacitor 43 is chosen to be large enough in value that it has no appreciable effect upon signals in the designed hearing range, which is about 250 Hz to about 4000 Hz. Above 4000–5000 Hz, capacitor 43 provides a shunt path around receiver 40, thereby greatly reducing the gain of the circuit at high frequencies, so as to increase the stability of the circuit.

Since no DC current flows through the receiver, as is the case in prior art circuits described above, there is no need to maintain a high impedance in the receiver. On the contrary, a low impedance receiver can give higher output, and greater efficiency by reducing the dissipation of part of the signal due to the resistive component of the receiver winding. In practice, high-Q low impedance receivers of about 1000 ohms have been found to be satisfactory. Additionally, the complementary output circuit of transistors 30 and 31 provides a low impedance source for driving the receiver and this improves fidelity and reduces distortion.

Figure 3:
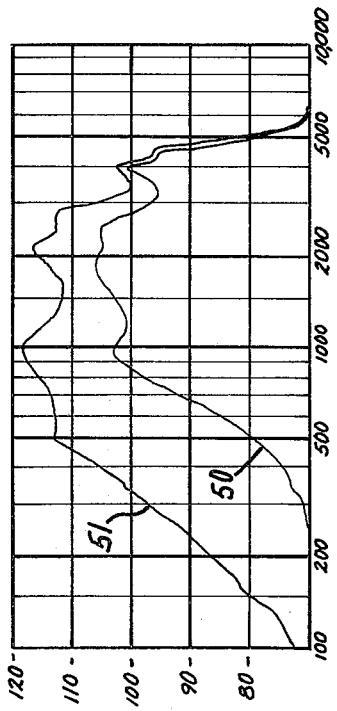
FIG. 3 is a graph illustrating the output characteristics of the circuit of FIG. 1.

Referring to FIG. 3, which is a graph of the operation of a circuit such as FIG. 1, curve 50 shows the output as a function of frequency for an input field of 60 db, and curve 51 is for an input of 80 db. Curve 50 shows the rapid fall off of response above 4000–50000 Hz, and also the rapid roll-off below about 800 Hz. In the mid-range, the response is more uniform, except for dips and peaks which are due to resonance effects of the receiver when driving a standard hearing aid coupler. The area of interest is the rapid bass roll-off below about 800 hz, which shows the response down about 20 db by 500 Hz. The receiver alone would provide a roll-off of about 6 db per octave. However, by taking the negative feedback voltage across the capacitor 42 of FIG. 1, a more rapid bass roll-off of approximately 12 db per octave is achieved. If necessary, even more roll-off can be introduced, for example, by proper selection of capacitor 20 or of the receiver impedance.

In many common types of hearing loss, hearing ability at higher frequencies is severely impaired, while hearing sensitivity for lower frequencies is the same as in normal persons. If uniform frequency response amplification were to be used, the amount of gain necessary to render the high frequency sounds audible, would result in raising the low frequency sounds to an intolerable level. Of course this would cause great discomfort to the wearer and would also seriously detract from the intelligibility of the signal, because of excessively loud "boominess" in the amplified sound. The output circuit of FIG. 1 accordingly accomplishes two desirable results by reducing power consumption and by providing a frequency selective feedback to provide the desired frequency response characteristic, all with a minimum number of components.

Figure 2:
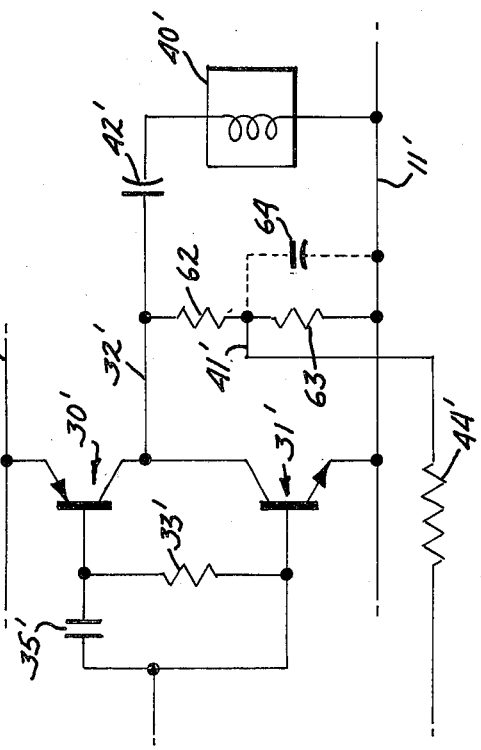
FIG. 2 is a schematic diagram of an alternate embodiment of the circuit of FIG. 1.

In FIG. 2, there is shown an alternate output connection for the basic circuit, for use in applications of severe hearing loss, where it is necessary to obtain a high gain across the entire useable frequency band, including the lower frequencies. In FIG. 2, components with primed numbers are the same as their corresponding components in FIG. 1. Thus, complementary output transistors 30' and 31' produce the output signal on lead 32' which is connected to their common collectors. However, in the circuit of FIG. 2, the blocking capacitor 42' is used only for blocking the DC bias component, but is not used to develop the frequency selective feedback voltage. Instead, the feedback voltage is developed across a simple voltage divider which comprises resistors 62 and 63. The voltage tapped from their junction at lead 41' is fed back through resistor 44' to the preamplifier. Of course, the ratio of the values of resistors 62 and 63 affects the gain of this circuit, as well as the ratio of feedback resistor 44' and resistor 45'. Since the feedback is taken across a resistive voltage divider in FIG. 2, the feedback is not frequency dependent, and the low frequency response of the circuit is determined primarily by the characteristics of the receiver 40'. However, if desired, for a given type of hearing loss, a capacitor 64, shown in broken lines, can be used to by-pass resistor 63 at higher frequencies, the value of the feedback resistors being adjusted as needed to achieve desired midband gain. Then at low frequencies, the amount of negative feedback begins to increase due to the increasing impedence of capacitor 64, and the overall gain of the circuit falls off.

The following list of component values is included by way of example only, to illustrate a typical circuit according to FIG. 1.

| | |
|---|---|
| R17 | 10K |
| R22 | 100K |
| R25 | 100K |
| R33 | 10K to 1Meg, select for bias |
| R45 | 100K to 1Meg, select for DC operating point |
| R49 | Approx. 270K, select for desired gain |
| All capacitors In Figure 2 | 1 Microfarad |
| R63 | 100K |
| R62 | Select for desired gain |

When properly adjusted, the circuit of FIG. 1, during quiescent operation, will have a voltage of approximately .55 volts on leads 23 and 34. The voltage at the base of transistor 30 will be approximately .75 volts, and the voltage at lead 32 will be approximately one-half the battery voltage.

While the circuit normally operates with the output transistors in Class A operation, it is possible to operate the circuit in Class AB mode. This accomplished by decreasing the value of resistor 33 in order to increase the bias current. In this mode, the output circuit can draw additional current from the battery for large AC signals. Class AB operation permits a higher maximum power output, and a higher efficiency at that higher output.

Referring to FIG. 1 it is possible to remove resistor 33 and capacitor 35, in which case the bases of transistors 31 and 30 would be connected directly together. In this case, the bias current may be established by placing a resistor in lead 13, in series, with the plus terminal of the battery and the rest of the amplifier circuit. The voltage drop across that resistor due to the current being drawn by the amplifier would establish the bias current for the output transistors. However, efficiency would be somewhat reduced due to the dissipation in the power supply resistor.

In summary, the present invention provides an extremely efficient, low current amplifier circuit having improved selective frequency response for use in hearing aids.

What is claimed is:

1. An ultra low current amplifier circuit for a hearing aid which has a microphone and a receiver, comprising:
   a. a single cell battery for providing DC power;
   b. a preamplifier connected to the microphone and operable to amplify signals produced thereby;
   c. an output stage comprising a complementary pair of transistors having their collectors interconnected and their emitters connected to the DC power source;
   d. means connected to said transistor pair for controlling the bias current therethrough;
   e. means for coupling signals directly from the preamplifier to the base of at least one of the complementary transistors;
   f. means including an output capacitor for connecting the receiver from the collectors of the transistor pair to signal ground; and
   g. means connected for providing negative feedback from the output stage of the amplifier to the preamplifier.

2. Apparatus according to claim 1 wherein said feedback means conveys DC feedback from the collectors of the transistor pair to the preamplifier for controlling the DC operating point of the transistor pair, and conveys AC feedback from said output capacitor to the preamplifier for providing a frequency selective feedback to reduce low frequency response.

3. Apparatus according to claim 1 wherein one terminal of said output capacitor is connected to signal ground, and said receiver is connected in series between the collectors of the transistor pair and the output capacitor, and wherein said feedback means connects to the common connection of said receiver and said output capacitor.

4. Apparatus according to claim 3 wherein said means for controlling the bias current comprises a bias resistor connected between the bases of the two transistors.

5. Apparatus according to claim 4 further including a by-pass capacitor connected across said bias resistor.

6. Apparatus according to claim 1 wherein said negative feedback means comprises a resistive voltage divider connected from the collectors of the transistor pair to the preamplifier.

7. In a hearing aid having a microphone, a preamplifier connected to said microphone for amplifying signals produced thereby, a receiver for converting amplified electrical signals into acoustic energy and a single cell battery connected for supplying power to circuitry within said hearing aid, the improvement which comprises an ultra low current drain power amplifier connected from the preamplifier to the receiver, said power amplifier comprising a complementary pair of transistors having their collectors interconnected and having their emitters connected to the appropriate polarities of the single cell battery for allowing current flow through the transistor pair, means connected to the transistor pair for controlling the bias current therethrough, means for applying amplified signals from the preamplifier directly to the base of at least one of the transistors, a blocking capacitor, and means for connecting the blocking capacitor and the receiver in series to the collectors of the transistor pair.

8. Apparatus according to claim 7 wherein said means for controlling the bias current comprises a resistor connected between the bases of said transistors.

9. Apparatus according to claim 8 further including means for by-passing the AC signal to be amplified around said resistor.

* * * * *

Dedication 3,995,114.—*Richard E. Marschinke*, St. Paul, Minn. ULTRA LOW CURRENT AMPLIFIER. Patent dated Nov. 30, 1976. Dedication filed July 24, 1978, by the assignee, *Dahlberg Electronics, Inc.*

Hereby dedicates to the Public the entire remaining term of said patent.

[*Official Gazette September 19, 1978.*]